United States Patent
Cheng et al.

(10) Patent No.: US 7,592,231 B2
(45) Date of Patent: Sep. 22, 2009

(54) MOS TRANSISTOR AND FABRICATION THEREOF

(75) Inventors: Po-Lun Cheng, Kaohsiung County (TW); Che-Hung Liu, Tainan County (TW)

(73) Assignee: United Microelectronics Corp., Hsinchu (TW)

( * ) Notice: Subject to any disclaimer, the term of this patent is extended or adjusted under 35 U.S.C. 154(b) by 284 days.

(21) Appl. No.: 11/461,639

(22) Filed: Aug. 1, 2006

(65) Prior Publication Data

US 2008/0032468 A1 Feb. 7, 2008

(51) Int. Cl.
H01L 21/336 (2006.01)
(52) U.S. Cl. .................................. 438/300; 438/595
(58) Field of Classification Search ................ 438/300, 438/491, 595, 950; 257/E21.431
See application file for complete search history.

(56) References Cited

U.S. PATENT DOCUMENTS 6,271,566 B1 * 8/2001 Tsuchiaki .................. 257/347
6,767,824 B2 * 7/2004 Nallan et al. ............... 438/633
6,989,322 B2 * 1/2006 Gluschenkov et al. ...... 438/595

* cited by examiner

Primary Examiner—Chandra Chaudhari
(74) Attorney, Agent, or Firm—J.C. Patents

(57) ABSTRACT

A method of fabricating a MOS transistor is described. A substrate is provided, and then a composite layer for forming a gate structure and a carbon-containing mask material layer are formed thereon in turn, wherein the carbon-containing mask material layer is formed with a carbon-containing precursor gas and a reaction gas. The carbon-containing mask material layer and the composite layer are patterned into a carbon-containing hard mask layer and a gate structure, respectively. A spacer is formed on the sidewalls of the gate structure and the carbon-containing hard mask layer. A passivation layer is formed over the substrate, and then a portion of the passivation layer is removed to expose a portion of the substrate. A doped epitaxial layer is formed on the exposed portion of the substrate.

40 Claims, 3 Drawing Sheets

MOS TRANSISTOR AND FABRICATION THEREOF

BACKGROUND OF THE INVENTION

1. Field of Invention

The present invention relates to a semiconductor device structure and fabrication of the same, and more particularly, to a metal-oxide-semiconductor (MOS) transistor structure and a method for fabricating the same.

2. Description of Related Art

MOS transistors are essential elements in VLSI or ULSI circuit products, which include microprocessors, semiconductor memory devices and power devices, etc.

In a nanometer-scale MOS process, usually, a trench is formed in the substrate beside the gate structure and then filled by a strained doped epitaxial layer as a source/drain (S/D), so as to improve the electron mobility or hole mobility. More specifically, in such a MOS process, a gate structure is formed with a hard mask layer thereon for protection in later steps, a spacer is formed on the sidewall of the gate structure, and a trench is formed in the substrate beside the spacer through lithography and etching. A pre-cleaning step is conducted to remove native oxide and etching residues from the trench, and a doped epitaxial layer is formed in the trench as the S/D or a part thereof.

However, since the etching steps for the spacer and the trench, the photoresist removal and the pre-cleaning step all damage the hard mask layer on the gate structure, the surface of the gate structure is easily exposed. If the surface of the gate structure is exposed, a polysilicon bump will be formed on the exposed portion of the poly-Si gate during the epitaxy process for forming the strained doped epitaxial layer. The poly-Si bump significantly lowers the reliability and the performance of the device.

SUMMARY OF THE INVENTION

In view of the foregoing, this invention provides a method for fabricating a MOS transistor that is capable of preventing exposure of the gate structure.

This invention also provides a MOS transistor that includes a carbon-containing hard mask layer capable of preventing exposure of the gate structure.

This invention further provides a method for fabricating a MOS transistor that is capable of preventing exposure of the gate structure more effectively.

This invention further provides a MOS transistor that includes a composite hard mask layer capable of preventing exposure of the gate structure more effectively, the composite hard mask layer including at least one carbon-containing layer.

A method for forming a MOS transistor of this invention is described below. A substrate is provided, and a composite layer for forming a gate structure and a carbon-containing mask material layer are sequentially formed on the substrate, wherein the carbon-containing mask material layer is formed with a carbon-containing precursor gas and a reaction gas. The carbon-containing mask material layer and the composite layer are then patterned into a carbon-containing hard mask layer and a gate structure, respectively. A spacer is formed on the sidewalls of the gate structure and the hard mask layer. A passivation layer is then formed over the substrate. A portion of the passivation layer is removed to expose a portion of the substrate, and then a doped epitaxial layer is formed on the exposed portion.

In some embodiments, the carbon-containing precursor gas includes bis(t-butyl-amino)silane, tetraethylortho-silicate (TEOS), triethoxysilane or hexamethyldisiloxane (HMDS). During formation of the carbon-containing mask material layer, the flow rate of the carbon-containing precursor gas may be set constant or be varied with time. When the carbon-containing precursor gas is bis(t-butyl-amino)silane, the flow rate thereof may be set within a range of about 100-235 sccm. When the carbon-containing precursor gas is TEOS, the flow rate thereof may be set within a range of about 100-1000 sccm. When the carbon-containing precursor gas is triethoxysilane, the flow rate thereof may be set within a range of about 100-1000 sccm. When the carbon-containing precursor gas is HMDS, the flow rate thereof may be set within a range of about 100-500 sccm.

In some embodiments, the carbon-containing mask material layer may include carbon-containing oxide, oxynitride or nitride. When the mask material layer includes carbon-containing oxide or oxynitride, the reaction gas may include $O_2$, $O_3$, NO or $N_2O$. When the mask material layer includes carbon-containing nitride, the reaction gas may include $N_2$ or $NH_3$.

The mask material layer may be formed through atmospheric pressure CVD (APCVD), low-pressure CVD (LPCVD), plasma-enhanced CVD (PECVD), high-density plasma CVD (HDP-CVD), radical-enhanced CVD (RECVD), atomic layer deposition (ALD), atomic-layer CVD (ALCVD) or any other suitable method.

In some embodiments, the above spacer may be a composite spacer that includes a first spacer on the sidewalls of the gate structure and the hard mask layer and a second spacer on the sidewall of the first spacer. The first spacer and the second spacer include different materials selected from SiO, SiN and SiON at least.

In some embodiments, after a portion of the passivation layer is removed but before the doped epitaxial layer is formed, a portion of the exposed substrate may be removed to form a trench, while the doped epitaxial layer fills up the trench at least.

In some embodiments, a stress layer may be formed over the substrate after the doped epitaxial layer is formed. After the doped epitaxial layer is formed but before the stress layer is formed, a portion of the spacer may be removed.

In some embodiments, the passivation layer may be removed after the doped epitaxial layer is formed.

In addition, when the MOS transistor is a PMOS transistor, the doped epitaxial layer may include P-doped SiGe. When the MOS transistor is an NMOS transistor, the doped epitaxial layer may include N-doped Si—C alloy.

A MOS transistor of this invention includes a substrate, a gate structure on the substrate, a carbon-containing hard mask layer on the gate structure, a spacer on the sidewalls of the gate structure and the carbon-containing hard mask layer, and a doped epitaxial layer in an area of the substrate beside the spacer.

In some embodiments, the carbon concentration in the carbon-containing hard mask layer is uniform. The carbon concentration may alternatively be non-uniform and may have a gradient distribution in the carbon-containing hard mask layer.

In some embodiments, the hard mask layer may include carbon-containing oxide, oxynitride or nitride. The spacer may include SiO, SiN or SiON.

In some embodiments, the doped epitaxial layer is disposed on the substrate in the area. The doped epitaxial layer may alternatively be entirely or partially embedded in a trench in the substrate in the area, filling up the trench at least.

In some embodiments, a stress layer may be further disposed over the substrate. The material of the stress layer may be SiN.

In some embodiments, the above spacer may be a composite spacer including a first spacer on the sidewalls of the gate structure and the carbon-containing hard mask layer and a second spacer on the sidewall of the first spacer. The first spacer and the second spacer include different materials selected from SiO, SiN and SiON at least. The substrate may be a bulk-Si substrate or a silicon-on-insulator (SOI) substrate.

In some embodiments, the gate structure may include a gate dielectric layer on the substrate and a gate on the gate dielectric layer. The gate dielectric layer may include SiO, SiN, SiON or a high-k (k>4) material.

In some embodiments, a metal silicide layer is further disposed on the doped epitaxial layer. The metal silicide layer may include titanium silicide, cobalt silicide, nickel silicide, palladium silicide, platinum silicide or molybdenum silicide.

Another method for fabricating a MOS transistor of this invention is described below. A substrate is provided, and then a composite layer for forming a gate structure and a composite mask material layer including at least one carbon-containing layer are sequentially formed on the substrate, wherein the carbon-containing layer is formed with a carbon-containing precursor gas and a reaction gas. Then, the composite mask material layer and the composite layer for forming a gate structure are patterned into a composite hard mask layer and a gate structure, respectively, and then a spacer is formed on the sidewalls of the gate structure and the composite hard mask layer. A passivation layer is formed over the substrate. A portion of the passivation layer is removed to expose a portion of the substrate, and then a doped epitaxial layer is formed on the exposed portion of the substrate.

In some embodiments, the carbon-containing precursor gas includes bis(t-butyl-amino)silane, tetraethylorthosilicate (TEOS), triethoxysilane or hexamethyldisiloxane.

In some embodiments, the carbon-containing layer includes carbon-containing oxide, oxynitride or nitride. If the carbon-containing layer includes carbon-containing oxide or oxynitride, the reaction gas may include $O_2$, $O_3$, NO or $N_2O$. If the carbon-containing layer includes C-containing nitride, the reaction gas may include $N_2$ or $NH_3$.

In addition, the carbon-containing layer may be formed with APCVD, LPCVD, PECVD, HDP-CVD, RECVD, ALD or ALCVD.

Another MOS transistor of this invention includes a substrate, a gate structure on the substrate, a composite hard mask layer on the gate structure including at least one carbon-containing layer, a spacer on sidewalls of the gate structure and the composite hard mask layer and a doped epitaxial layer in an area of the substrate beside the spacer.

In some embodiments, the carbon concentration in the carbon-containing layer is uniform. The carbon concentration may alternatively be non-uniform and may have a gradient distribution in the carbon-containing layer.

Since the hard mask layer on the gate structure contains carbon in this invention and C—Si bonding is stronger than O/N—Si bonding, the hard mask layer is less damaged in later etching processes as compared with conventional hard mask materials free of carbon. Therefore, the gate structure is not easily exposed, so that a poly-Si bump is not formed on the gate and the reliability and performance of the device are improved.

In order to make the aforementioned and other objects, features and advantages of this invention comprehensible, some embodiments accompanied with drawings are described in detail below.

DESCRIPTION OF EMBODIMENTS

FIGS. 1A-1F illustrate, in a cross-sectional view, a process flow of fabricating a MOS transistor according to an embodiment of this invention.

Figure 1A:
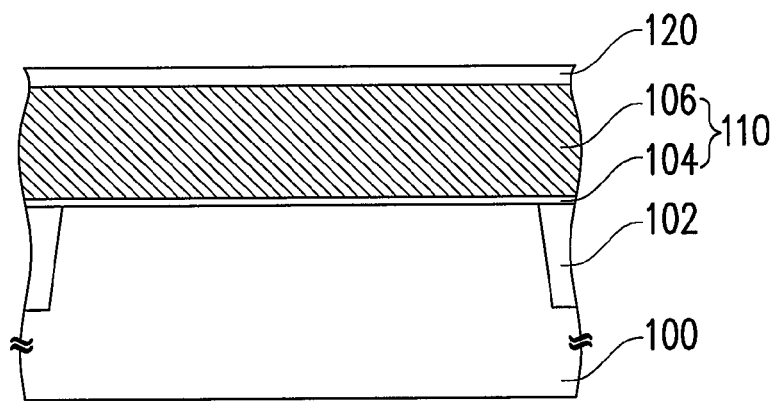
FIGS. 1A-1F illustrate, in a cross-sectional view, a process flow of fabricating a MOS transistor according to an embodiment of this invention.

Referring to FIG. 1A, a substrate 100 formed with an STI structure 102 therein is provided, possibly being a bulk-Si substrate or a silicon-on-insulator (SOI) substrate. A composite layer 110 for forming a gate structure, which may include a gate dielectric layer 104 and a gate material layer 106 thereon, is then formed on the substrate 100. The material of the gate dielectric layer 104 may be SiO, SiN, SiON or a high-k (k>4) material, and that of the gate material layer 106 may be doped poly-Si. The gate dielectric layer 104 and the gate material layer 106 each may be formed through CVD.

A carbon-containing mask material layer 120 is then formed on the composite layer 110. The mask material layer 120 may include carbon-containing oxide, carbon-containing nitride or carbon-containing oxynitride, and may be formed through APCVD, LPCVD, PECVD, HDP-CVD, RECVD, ALD or ALCVD. It is noted that since C—Si bonding is stronger than O/N—Si bonding, the carbon-containing hard mask layer formed from the layer 120 is etched more slowly than a conventional one. Hence, exposure of the gate structure is prevented more effectively in subsequent etching steps.

The carbon-containing mask material layer 120 may be formed by introducing a carbon-containing precursor gas and a reaction gas into a chamber and inducing a chemical reaction to form a solid product that is deposited on the composite layer 110. For example, when a mask material layer 120 including C-containing oxide is to be formed, the introduced gases may include a C-containing precursor gas and an O-source gas. The C-containing precursor gas may be a Si-based gas containing carbon, such as bis(t-butylamino)silane, tetraethylorthosilicate (TEOS), triethoxysilane or hexamethyl-disiloxane (HMDS), while the O-source gas may be oxygen gas or ozone. When the carbon-containing precursor gas is bis(t-butylamino)silane, the flow rate thereof may be set within a range of about 100-235 sccm. When the carbon-containing precursor gas is TEOS, the flow rate thereof may be set within a range of about 100-1000 sccm. When the carbon-containing precursor gas is triethoxysilane, the flow rate thereof may be set within a range of about 100-1000 sccm. When the carbon-containing precursor gas is HMDS, the flow rate thereof may be set within a range of about 100-500 sccm. Similarly, when a mask material layer 120 including carbon-containing oxynitride is to be formed, the introduced gases may include a C-containing precursor gas and an O/N-source gas. The C-containing precursor gas may be the same as above, while the O/N-source gas may be NO or $N_2O$. When a mask material layer 120 including C-containing nitride is to be formed, the introduced gases may include a C-containing precursor gas and an N-source gas. The C-containing precursor gas may be the same as above, while the N-source gas may be $N_2$ or $NH_3$.

In addition, by adjusting the flow rate of the C-containing precursor gas in the CVD process, the carbon concentration in the C-containing mask material layer 120 can be adjusted to improve the etching resistance thereof. For example, when the flow rate of the C-containing precursor gas is set constant in the CVD, the carbon concentration in the C-containing mask material layer 120 is uniform. When the flow rate of the C-containing precursor gas is increased with time, the carbon concentration in the mask material layer 120 increases from bottom to top so that the etching resistance increases in the same manner. When the flow rate of the carbon-containing precursor gas is decreased with time, the carbon concentration in the mask material layer 120 decreases from bottom to top so that the etching resistance decreases in the same manner. The flow rate variation profile of the C-containing precursor gas may be more complicated, so that a specific carbon concentration profile can be made for particular requirements.

Figure 1B:
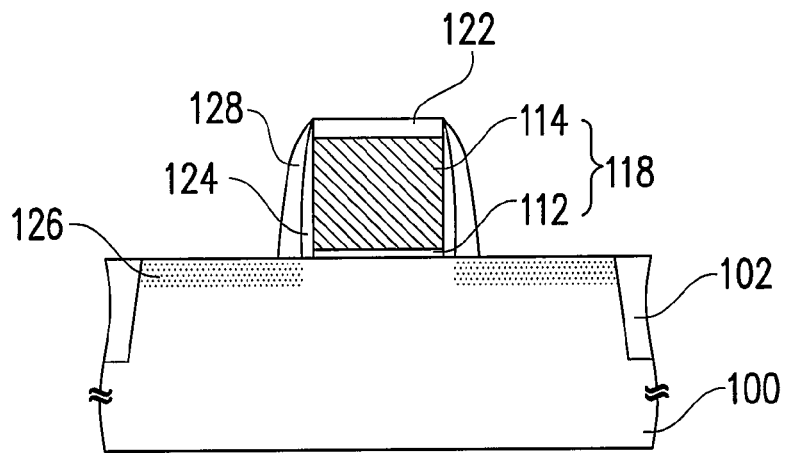

Referring to FIG. 1B, the carbon-containing mask material layer 120 and the composite layer 110 are patterned into a carbon-containing hard mask layer 122 and a gate structure 118, respectively. The two layers 120 and 110 may be patterned with the following steps, for example. A patterned photoresist layer (not shown) is formed on the mask material layer 120, and is then used as an etching mask to remove a portion of the mask material layer 120 to form a carbon-containing hard mask layer 122. After the patterned photoresist layer is removed, the carbon-containing hard mask layer 122 is used as an etching mask to remove the exposed composite layer 110 and form a gate structure 118 that includes a gate dielectric layer 112 and a gate electrode 114 thereon.

A spacer 124 is then formed on the sidewalls of the gate structure 118 and the hard mask layer 122. The spacer 124 may include SiO, SiN or SiON, and may be formed by forming over the substrate 100 a conformal spacer-material layer (not shown) and then removing a portion thereof with anisotropic etching. It is noted that since C—Si bonding is stronger than O/N—Si bonding, the carbon-containing hard mask layer 122 is etched more slowly than a conventional one. Hence, exposure of the gate structure 118 is prevented more effectively in the anisotropic etching for forming the spacer 124 and in the subsequent etching steps. S/D extension regions 126 are then formed in the substrate 100 beside the spacer 124, possible through an ion implantation process using the gate structure 118 and the spacer 124 as a mask.

Then, another spacer 128 is optionally formed on the sidewall of the spacer 124, while the spacer 128 and the spacer 124 together constitute a composite spacer. The material of the spacer 128 may also be SiO, SiN or SiON, but is different from that of the spacer 124 to prevent the spacer 124 from being removed in the later etching step of the spacer 128. The spacer 128 may be formed as in the case of the spacer 124.

Figure 1C:
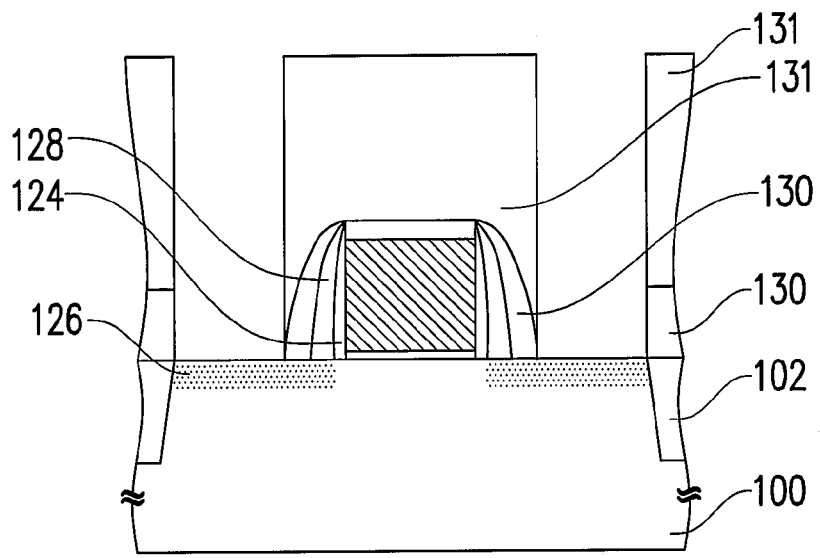

Referring to FIG. 1C, a passivation layer 130 is formed over the substrate 100, possibly including SiN and possibly being formed with CVD. The layer 130 is then patterned to expose the gate structure 118 and an adjacent portion of the substrate 100, while a portion of the passivation layer 130 remains on the sidewall of the spacer 128. The layer 130 is formed for protecting other device areas on the substrate 100 from being affected in the later steps. A patterned photoresist layer 131 is then formed over the substrate 100, exposing a portion of the substrate 100 where a trench will be formed later, i.e., the portion exposed by the patterned passivation layer 130.

Figure 1D:
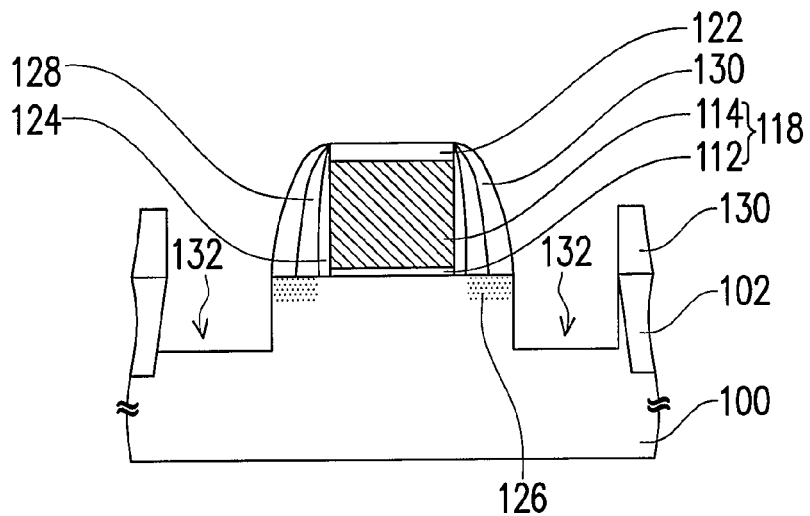

Referring to FIG. 1D, an etching step is done with the patterned photoresist layer 131 as a mask to remove a portion of the exposed substrate 100 and form a trench 132. The photoresist layer 131 is then removed, possibly followed by a cleaning step for removing the photoresist residue as well as a pre-cleaning process for removing native oxide or other impurity on the trench surface to improve the quality of the later-formed doped epitaxial layer. The gate structure 118 is also protected by the C-containing hard mask layer 122 in the photoresist removal, the cleaning step and the pre-cleaning.

Figure 1E:
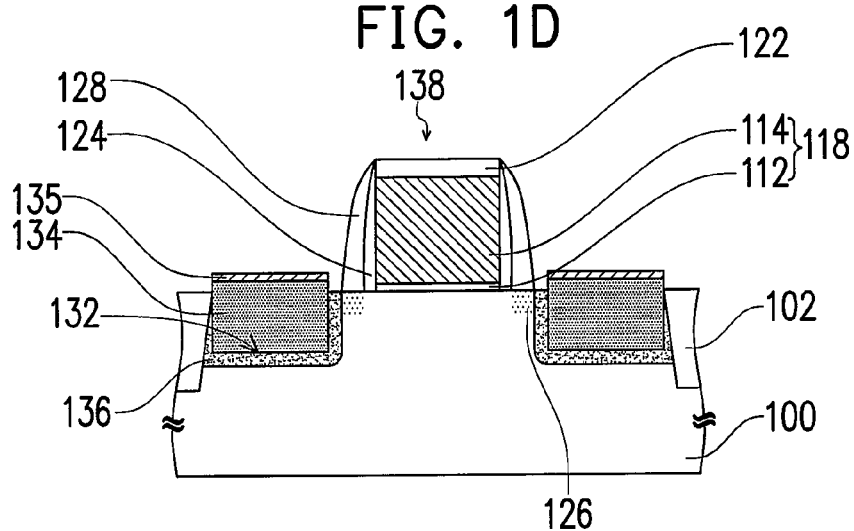

Referring to FIG. 1E, a doped epitaxial layer 134 is formed in the trench 132, at least filling up the trench 132. In FIG. 1E, the top surface of the doped epitaxial layer 134 is higher than that of the substrate 100. In other embodiments, however, the top surface of the layer 134 may be coplanar with that of the substrate 100. The doped epitaxial layer 134 may be formed through selective epitaxial growth (SEG) with in-situ doping. In addition, when the MOS transistor is a PMOS transistor, the material of the doped epitaxial layer 134 may be B-doped SiGe; when the MOS transistor is an NMOS transistor, the material of the doped epitaxial layer 134 may be P/As-doped Si—C alloy. It is noted that since the other device areas are covered by the passivation layer 130, the doped epitaxial layer 134 is formed only in the trench 132.

After the passivation layer 130 is etched away, doped regions 136 as portions of the S/D are formed in the substrate 100 beside the spacer 128 possibly through ion implantation with the gate structure 118 and the spacers 124 and 128 as a mask. In another embodiment, the doped regions 136 may be formed before the trench 132 is formed, while the trench 132 has to be formed shallower than the doped regions 136. In still another embodiment, the doped regions 136 may be formed after the trench 132 is formed but before the doped epitaxial layer 134 is formed.

Then, a metal silicide layer 135 is formed on the epitaxial layer 134 in option. The metal silicide layer 135 may include titanium silicide, cobalt silicide, nickel silicide, palladium silicide, platinum silicide or molybdenum silicide, and may be formed with a salicide process. The gate structure 118, the hard mask layer 122, the spacer 124, the S/D extension regions 126, the spacer 128, the doped epitaxial layer 134, the doped regions 136 and the metal silicide layer 135 together constitute a MOS transistor 138.

Figure 1F:
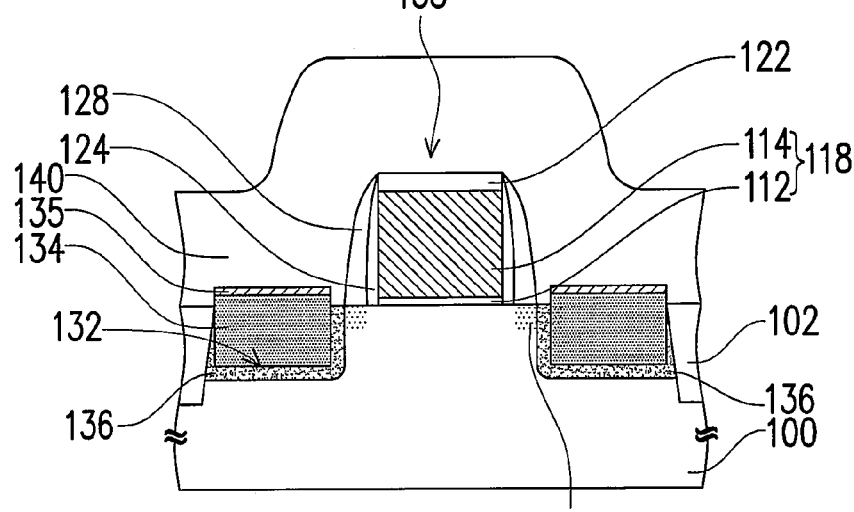

Referring to FIG. 1F, a stress layer 140 is formed over the substrate 100 in option, possibly including SiN and possibly formed through CVD. When the MOS transistor 138 is a PMOS (or NMOS) transistor, the stress layer 140 is a compressive (or tensile) stress layer.

It is particularly noted that the stress applied to the channel by the stress layer 140 is increased with decrease in the distance between the stress layer 140 and the channel. Hence, a portion of the composite spacer (124+128), which is usually a portion or the whole of the spacer 128, may be removed before the stress layer 140 is formed to decrease the above-mentioned distance.

The MOS transistor of this embodiment is shown in FIG. 1F. The materials of all parts of the structure have been described above and are not repeated again.

Referring to FIG. 1F, a MOS transistor 138 is disposed in an active area defined by an STI structure 102 in the substrate 100, including a gate structure 118, a carbon-containing hard mask layer 122, a spacer 124, S/D extension regions 126, a spacer 128, a doped epitaxial layer 134, a metal silicide layer 135 and doped regions 136. The gate structure 118 is disposed on the substrate 100, including a gate dielectric layer 112 and a gate electrode 114. The hard mask layer 122 is disposed on the gate structure 118. The spacer 124 is disposed on the sidewalls of the hard mask layer 122 and the gate structure 118. S/D extension regions 126 are located in the substrate 100 beside the spacer 124. The spacer 128 is optionally disposed on the sidewall of the spacer 124 to constitute a composite spacer together with the spacer 124. The doped epitaxial layer 134 is disposed beside the spacer 128. The doped epitaxial layer 134 is mostly embedded in a trench 132 in the substrate 100 with a top surface higher than that of the substrate 100 in FIG. 1F. In other embodiments, the epitaxial layer 134 may be entirely embedded in the trench 132 with a top surface coplanar with that of the substrate 100. The metal silicide layer 135 is disposed on the epitaxial layer 134.

The carbon-containing mask material layer 120 may have a controlled carbon concentration distribution to improve the etching resistance. The carbon concentration in the mask material layer 120 can be uniform, or increases or decreases from bottom to top. The concentration distribution may be more complicated for some requirements.

A stress layer 140 may be further disposed over the substrate 100. The stress layer 140 covers the whole MOS transistor 138 to effectively improve the performance thereof. When the MOS transistor 138 is a PMOS (or NMOS) transistor, the stress layer 140 is a compressive (or tensile) stress layer. Moreover, for the stress applied to the channel region by the stress layer 140 is increased with decrease in the distance between the stress layer 140 and the channel, the width of the spacer 128 may be decreased to decrease the distance between the stress layer 140 and the channel.

Figure 2:
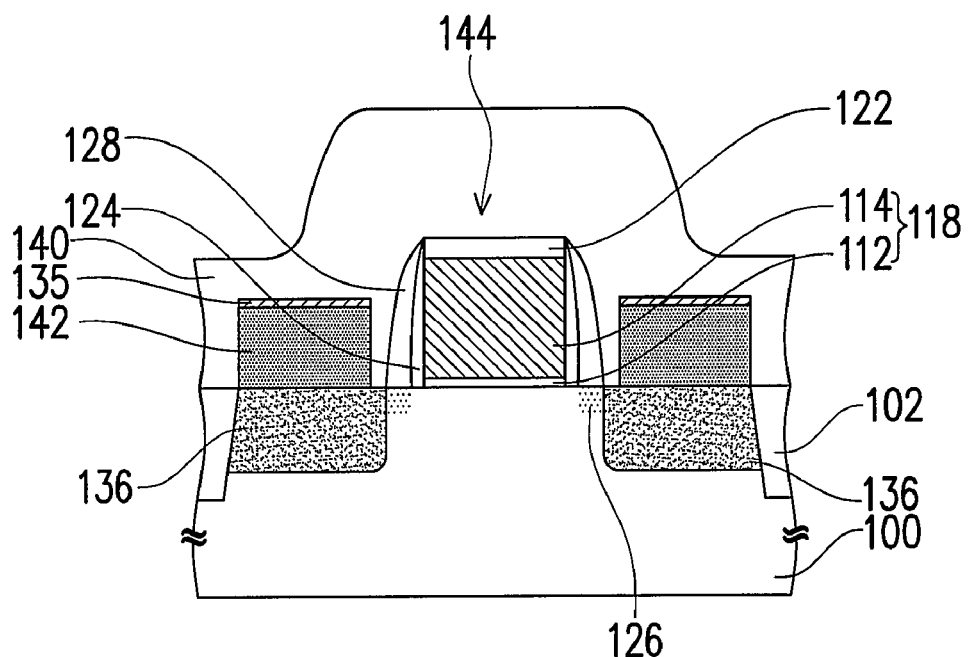
FIG. 2 depicts a cross-sectional view of a MOS transistor according to another embodiment of this invention.

FIG. 2 depicts a cross-sectional view of a MOS transistor according to another embodiment. The MOS transistor 144 is different from the MOS transistor 138 of FIG. 1F in that the doped epitaxial layer 142 is disposed on the surface of the substrate 100 beside the spacer 128. To form such a structure, no trench is formed in the substrate 100 after the passivation layer 130 is patterned (see FIG. 1C) and the doped epitaxial layer 142 is directly formed based on the exposed surface of substrate 100.

Figure 3:
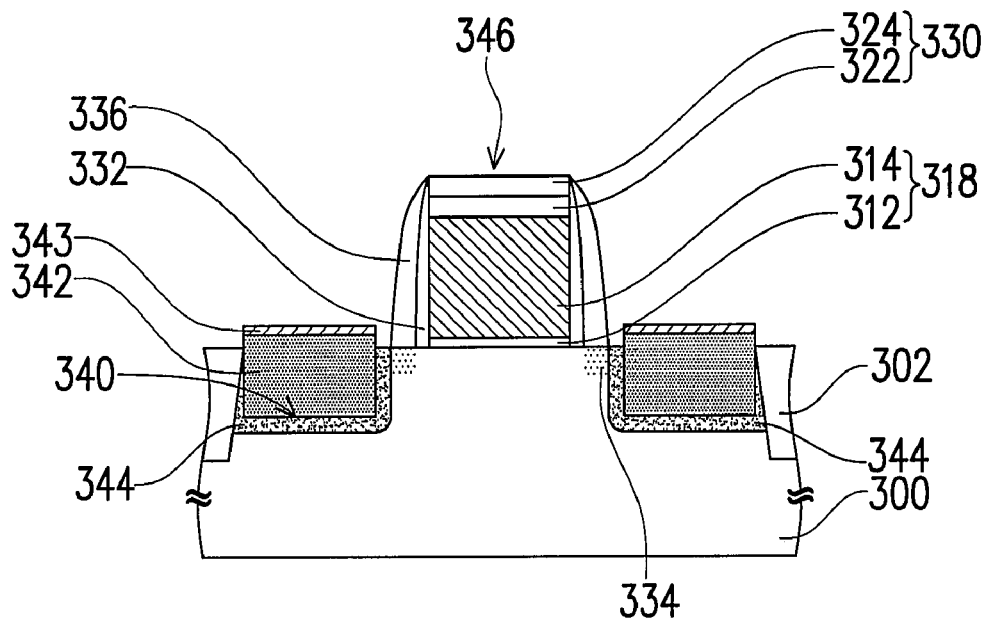
FIG. 3 depicts a cross-sectional view of a MOS transistor according to still another embodiment of this invention.

In still another embodiment of this invention, the C-containing hard mask layer is replaced by a composite hard mask layer that includes at least one C-containing layer. FIG. 3 depicts a cross-sectional view of such a MOS transistor.

Referring to FIG. 3, a MOS transistor 346 is disposed in an active area defined by an STI structure 302 in a substrate 300, including a gate structure 318, a composite hard mask layer 330 including at least one carbon-containing layer, a spacer 332, S/D extension regions 334, a spacer 336, a doped epitaxial layer 342, a metal silicide layer 343 and doped regions 344. The gate structure 318 is disposed on the substrate 300, including a gate dielectric layer 312 and a gate electrode 314 thereon. The composite hard mask layer 330 is disposed on the gate structure 318, including two C-containing layers 322 and 324. The spacer 332 is disposed on the sidewalls of the gate structure 318 and the composite hard mask layer 330. The S/D extension regions 334 are located in the substrate 300 beside the spacer 332. The spacer 336 is optionally disposed on the sidewall of the spacer 332 to constitute a composite spacer together with the spacer 332. The doped epitaxial layer 342 is disposed beside the spacer 336. The epitaxial layer 342 is mostly embedded in a trench 340 in the substrate 300 with a top surface higher than that of the substrate 300 in FIG. 3. In other embodiment, the doped epitaxial layer 342 may be entirely embedded in the trench 340 with a top surface coplanar with that of the substrate 300. In addition, the metal silicide layer 343 is disposed on the doped epitaxial layer 342.

It is particularly noted that the material of each layer in the composite hard mask layer 330 should match that of the spacers 332 and 336. When the carbon-containing layer 324 includes carbon-containing nitride, for example, the material of the spacer 332 may be SiO or SiON so that the layer 324 is not removed during formation of the spacer 332. Thus, the gate structure 318 is not easily exposed.

In addition, the composite hard mask layer 330 may alternatively include a carbon-containing layer and a carbon-free layer, wherein the carbon concentration in the carbon-containing layer may be uniform or non-uniform.

The materials and forming methods of all parts of the structure in FIG. 3 except the composite hard mask layer 330 may be the same as those of the corresponding parts of the structure in FIG. 1F. An exemplary process of forming the composite hard mask layer 330 is described as follows, in reference of FIGS. 1A and 3.

Referring to FIG. 1A, after the composite layer 110 is formed, a first and a second carbon-containing material layers are formed thereon in sequence, wherein each carbon-containing material layer may be formed with the same method of forming the mask material layer 120. The two carbon-containing material layers and the composite layer 110 are then patterned to form a composite hard mask layer 330 including two carbon-containing layers 322 and 324 and a gate structure 318, respectively.

In yet another embodiment, the doped epitaxial layer 342 in the above device structure is alternatively formed/disposed on the substrate 300. The resulting structure looks the same as a modified form of the structure in FIG. 2 obtained by replacing the hard mask layer 122 with the composite hard mask layer 330 in FIG. 3.

Since the hard mask layer on the gate structure contains carbon in this invention and C—Si bonding is stronger than O/N—Si bonding, the hard mask layer is less damaged in later etching processes as compared with conventional hard mask materials free of carbon. Thus, the gate structure is not easily exposed, so that a poly-Si bump is not formed on the gate and the reliability and performance of the device are improved.

The present invention has been disclosed above in the preferred embodiments, but is not limited to those. It is known to persons of ordinary skill in the art that some modifications and innovations may be made without departing from the spirit and scope of this invention. Hence, the scope of this invention should be defined by the claims.

What is claimed is:

1. A method for forming a MOS transistor, comprising:
   providing a substrate;
   sequentially forming a composite layer for forming a gate structure and a carbon-containing mask material layer on the substrate, wherein the carbon-containing mask material layer is formed with a carbon-containing precursor gas and a reaction gas;
   patterning the carbon-containing mask material layer and the composite layer into a carbon-containing hard mask layer and a gate structure, respectively;
   forming a spacer on sidewalls of the gate structure and the carbon-containing hard mask layer;
   forming a passivation layer over the substrate;
   removing a portion of the passivation layer to expose an area of the substrate; and
   forming a doped epitaxial layer in the exposed area of the substrate.

2. The method of claim 1, wherein the carbon-containing precursor gas comprises bis(t-butylamino)silane, tetraethylorthosilicate (TEOS), triethoxysilane or hexamethyl-disiloxane (HMDS).

3. The method of claim 1, wherein a flow rate of the carbon-containing precursor gas is set constant during formation of the carbon-containing mask material layer.

4. The method of claim 1, wherein a flow rate of the carbon-containing precursor gas is varied with time during formation of the carbon-containing mask material layer.

5. The method of claim 2, wherein the carbon-containing precursor gas comprises bis(t-butylamino)silane and has a flow rate set within a range of about 100-235 sccm.

6. The method of claim 2, wherein the carbon-containing precursor gas comprises tetraethylorthosilicate and has a flow rate set within a range of about 100-1000 sccm.

7. The method of claim 2, wherein the carbon-containing precursor gas comprises triethoxysilane and has a flow rate set within a range of about 100-1000 sccm.

8. The method of claim 2, wherein the carbon-containing precursor gas comprises hexamethyldisiloxane and has a flow rate set within a range of about 100-500 sccm.

9. The method of claim 1, wherein the carbon-containing mask material layer comprises carbon-containing oxide, carbon-containing oxynitride or carbon-containing nitride.

10. The method of claim 9, wherein the carbon-containing mask material layer comprises carbon-containing oxide or carbon-containing oxynitride, and the reaction gas comprises $O_2$, $O_3$, NO or $N_2O$.

11. The method of claim 9, wherein the carbon-containing mask material layer comprises carbon-containing nitride, and the reaction gas comprises $N_2$ or $NH_3$.

12. The method of claim 1, wherein the carbon-containing mask material layer is formed through APCVD, LPCVD, PECVD, HDP-CVD, RECVD, ALD or ALCVD.

13. The method of claim 1, wherein the spacer is a composite spacer comprising a first spacer on the sidewalls of the gate structure and the carbon-containing hard mask layer and a second spacer on a sidewall of the first spacer.

14. The method of claim 13, wherein the first spacer and the second spacer comprise different materials selected from a group consisting of SiO, SiN and SiON at least.

15. The method of claim 1, further comprising removing a portion of the exposed substrate to form a trench after a portion of the passivation layer is removed but before the doped epitaxial layer is formed, wherein the doped epitaxial layer fills up the trench at least.

16. The method of claim 1, further comprising forming a stress layer over the substrate after the doped epitaxial layer is formed.

17. The method of claim 16, further comprising removing a portion of the spacer after the doped epitaxial layer is formed but before the stress layer is formed.

18. The method of claim 1, further comprising removing the passivation layer after the doped epitaxial layer is formed.

19. The method of claim 1, wherein the MOS transistor is a PMOS transistor, and the doped epitaxial layer comprises P-doped SiGe.

20. The method of claim 1, wherein the MOS transistor is an NMOS transistor, and the doped epitaxial layer comprises N-doped Si—C alloy.

21. A method for fabricating a MOS transistor, comprising:
providing a substrate;
sequentially forming, on the substrate, a composite layer for forming a gate structure and a composite mask material layer that comprises at least one carbon-containing layer, wherein at least one carbon-containing layer is formed with a carbon-containing precursor gas and a reaction gas;
patterning the composite mask material layer and the composite layer for forming a gate structure into a composite hard mask layer and a gate structure, respectively;
forming a spacer on sidewalls of the gate structure and the composite hard mask layer;
forming a passivation layer over the substrate;
removing a portion of the passivation layer to expose an area of the substrate; and
forming a doped epitaxial layer in the exposed area of the substrate.

22. The method of claim 21, wherein the carbon-containing precursor gas comprises bis(t-butylamino)silane, tetra-ethyl-orthosilicate (TEOS), triethoxysilane or hexamethyldisiloxane (HMDS).

23. The method of claim 21, wherein a flow rate of the carbon-containing precursor gas is set constant during formation of the carbon-containing layer.

24. The method of claim 21, wherein a flow rate of the carbon-containing precursor gas is varied with time during formation of the carbon-containing layer.

25. The method of claim 22, wherein the carbon-containing precursor gas comprises bis(t-butylamino)silane and has a flow rate set within a range of about 100-235 sccm.

26. The method of claim 22, wherein the carbon-containing precursor gas comprises tetraethylorthosilicate and has a flow rate set within a range of about 100-1000 sccm.

27. The method of claim 22, wherein the carbon-containing precursor gas comprises triethoxysilane and has a flow rate set within a range of about 100-1000 sccm.

28. The method of claim 22, wherein the carbon-containing precursor gas comprises hexamethyldisiloxane and has a flow rate set within a range of about 100-500 sccm.

29. The method of claim 21, wherein the carbon-containing layer comprises carbon-containing oxide, carbon-containing oxynitride or carbon-containing nitride.

30. The method of claim 29, wherein the carbon-containing layer comprises carbon-containing oxide or carbon-containing oxynitride, and a reaction gas for forming the carbon-containing layer contains $O_2$, $O_3$, NO or $N_2O$.

31. The method of claim 29, wherein the carbon-containing layer comprises carbon-containing nitride, and the reaction gas comprises $N_2$ or $NH_3$.

32. The method of claim 21, wherein the carbon-containing layer is formed with APCVD, LPCVD, PLC VD, I-IDP-CVD, RECVD, ALD or ALCVD.

33. The method of claim 21, wherein the spacer is a composite spacer comprising a first spacer on the sidewalls of the gate structure and the composite hard mask layer and a second spacer on a sidewall of the first spacer.

34. The method of claim 33, wherein the first and the second spacers comprise different materials selected from a group consisting of SiO, SiN and SiON at least.

35. The method of claim 21, further comprising removing a portion of the exposed substrate to form a trench after a portion of the passivation layer is removed but before the doped epitaxial layer is formed, wherein the doped epitaxial layer fills up the trench at least.

36. The method of claim 21, further comprising forming a stress layer over the substrate after the doped epitaxial layer is formed.

37. The method of claim 36, further comprising removing a portion of the spacer after the doped epitaxial layer is formed but before the stress layer is formed.

38. The method of claim 21, further comprising removing the passivation layer after the doped epitaxial layer is formed.

39. The method of claim 21, wherein the MOS transistor is a PMOS transistor, and the doped epitaxial layer comprises P-doped SiGe.

40. The method of claim 21, wherein the MOS transistor is an NMOS transistor, and the doped epitaxial layer comprises N-doped Si—C alloy.

* * * * *